United States Patent
Pawlikiewicz

(10) Patent No.: US 8,099,270 B2
(45) Date of Patent: Jan. 17, 2012

(54) SIMULATION MODEL FOR TRANSISTORS

(75) Inventor: Adam H. Pawlikiewicz, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 497 days.

(21) Appl. No.: 12/235,833

(22) Filed: Sep. 23, 2008

(65) Prior Publication Data

US 2010/0076742 A1  Mar. 25, 2010

(51) Int. Cl.
*G06F 17/50* (2006.01)
*G06F 9/455* (2006.01)
*G06G 7/48* (2006.01)

(52) U.S. Cl. .............. 703/14; 703/4; 703/13; 716/106
(58) Field of Classification Search .............. 703/14, 703/15, 13, 4; 716/106
See application file for complete search history.

(56) References Cited

U.S. PATENT DOCUMENTS

| 6,539,527 | B2 * | 3/2003 | Naffziger et al. ............. 716/115 |
| 2002/0193959 | A1 * | 12/2002 | Wanek et al. .................. 702/117 |
| 2003/0154064 | A1 * | 8/2003 | Gauthier et al. ............... 703/14 |
| 2006/0248518 | A1 * | 11/2006 | Kundert ......................... 717/140 |
| 2009/0172649 | A1 * | 7/2009 | Teplitsky et al. ............. 717/143 |

OTHER PUBLICATIONS

Martin, Antonio J. Lopez, "Tutorial Cadence Design Environment", Oct. 2002, Klipsch School of Electrical and Computer Engineering, New Mexico State University, pp. 9, 10, and 13.*
Souissi, Heithem, "Beta Rolloff & Avalanche Breakdown", Mar. 6, 2002, slide 20.*
Kimata et al. "Smart IGBT Model and Its Application for Power Converter Design", 1994, IEEE.*

* cited by examiner

*Primary Examiner* — Paul Rodriguez
*Assistant Examiner* — Cedric D Johnson
(74) *Attorney, Agent, or Firm* — Fish & Richardson P.C.

(57) ABSTRACT

Various embodiments include methods and apparatus for simulating a transistor using a simulation model that includes a transistor simulation model coupled to diode simulation model.

20 Claims, 5 Drawing Sheets

US 8,099,270 B2

SIMULATION MODEL FOR TRANSISTORS

BACKGROUND

Transistors are electrical components in computers, televisions, cellular phones, and many other electronic products. Designers usually use simulator programs to simulate a schematic version of the transistor to observe its circuit behavior.

Gummel Poon and Vertical Bipolar Intercompany (VBIC) transistor simulation models are widely used in many conventional simulators to simulate transistors. However, in some cases, using these conventional transistor simulation models may result in inaccurate prediction of the circuit behavior of some transistors.

DETAILED DESCRIPTION

Figure 1:
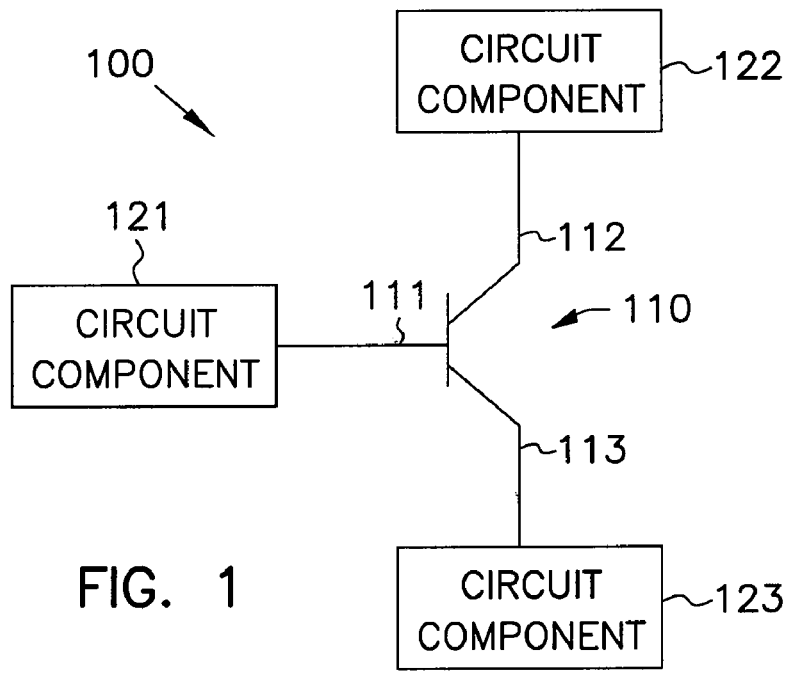
FIG. 1 is a schematic diagram showing a portion of an electronic circuit including a transistor and circuit components.

FIG. 1 is a schematic diagram 100 showing a portion of an electronic circuit including a transistor 110 and circuit components 121, 122, and 123. Circuit components 121, 122, 123 may include one or more resistors, capacitors, or other components coupled to base 111, collector 112, and emitter 113 terminals of bipolar junction transistor (BJT) 110 as shown in FIG. 1.

Figure 2:
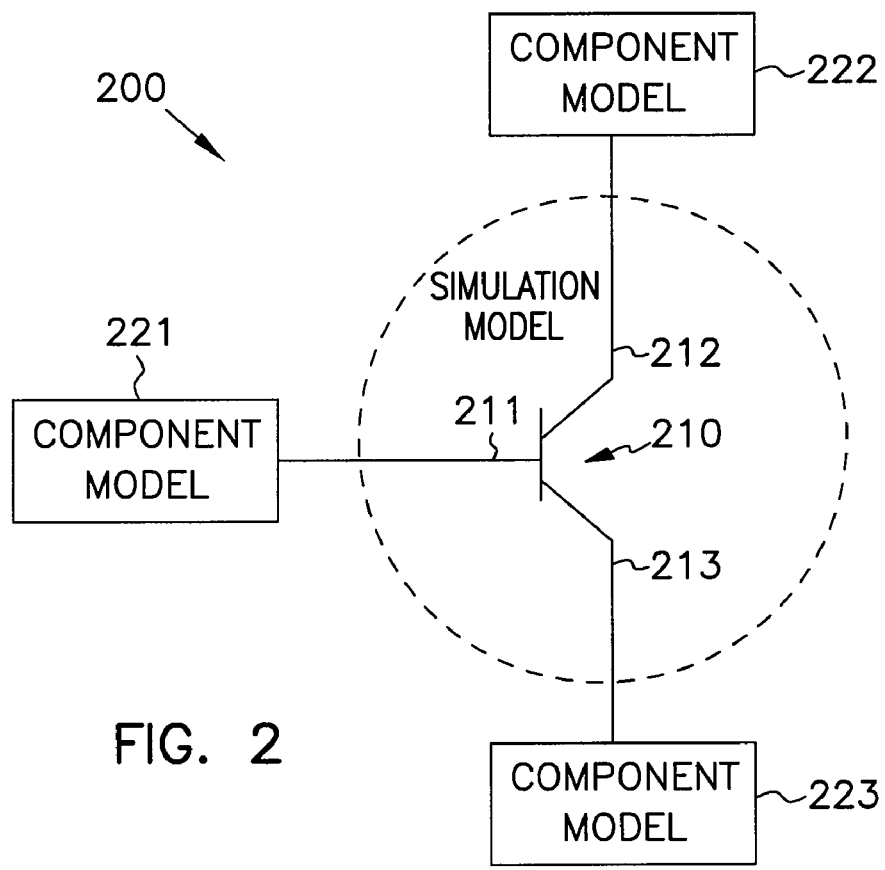
FIG. 2 is a simulation diagram showing simulation models for the components of FIG. 1 using conventional techniques.

FIG. 2 is a simulation diagram 200 showing simulation models for the components of FIG. 1 using conventional techniques. A simulator, such as a Simulation Program with Integrated Circuit Emphasis (SPICE) simulator, may use simulation diagram 200 to simulate the circuit shown in FIG. 1. As shown in FIG. 2, simulation diagram 200 represents a simulation model of schematic diagram 100 in a component-to-component arrangement fashion. For example, a transistor simulation model 210 of FIG. 2 represents a simulation model of transistor 110 of FIG. 1. Component models 221, 222, and 223 of FIG. 2 represent simulation models of the corresponding circuit components 121, 122, and 123 of FIG. 1. Transistor simulation model 210 includes base 211, collector 212, and emitter 213 terminals corresponding to base 111, collector 112, and emitter 113 terminals of transistor 110. A simulator that simulates the circuit of FIG. 1 based on simulation diagram 200 may provide simulated information, such as the operating characteristics of transistor 110, in various forms, e.g., in the form of graphs.

Figure 3:
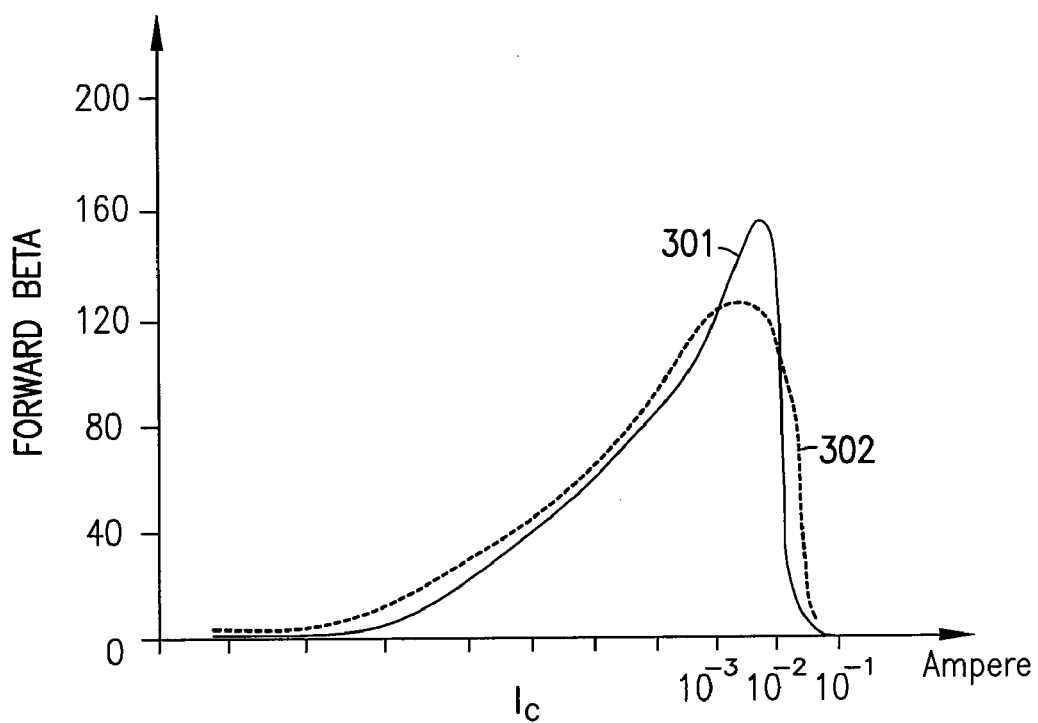
FIG. 3 is a graph showing curves representing a relationship between some operating parameters of the components of FIG. 1 and simulation models of FIG. 2.

FIG. 3 is a graph showing curves 301 and 302 representing a relationship between some operating parameters of the components of FIG. 1 and the simulation models of FIG. 2. In FIG. 3, curve 301 shows measured information that represents a relationship between a forward beta and a collector current $I_C$ measured from a physical transistor, which may be schematically represented as transistor 110 of schematic diagram 100 of FIG. 1. Curve 302 of FIG. 3 shows simulated information that represents a relationship between the forward beta and the collector current $I_C$ of transistor simulation model 210 obtained from a simulation (e.g., SPICE simulation) based on simulation diagram 200 of FIG. 2. As shown in FIG. 3, curves 301 and 302 do not always closely fit with each other when the collector current $I_C$ is approximately one milliampere (mA) or $10^{-3}$ A to approximately 100 mA (or $10^{-2}$ A).

Figure 4:
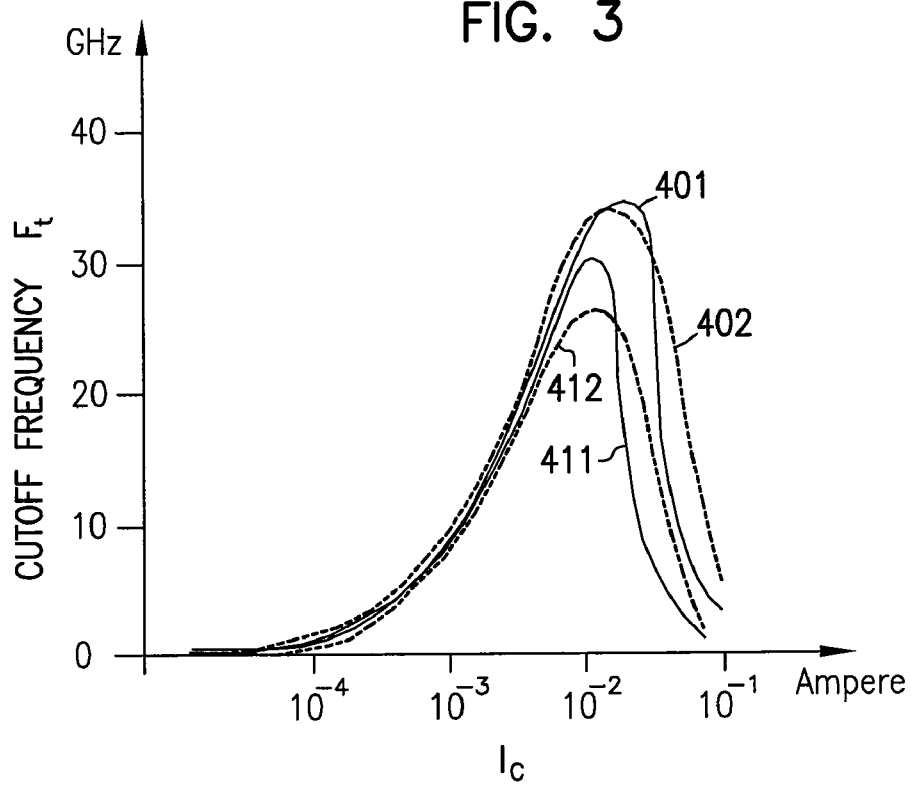
FIG. 4 is a graph showing curves representing a relationship between some other operating parameters of the components of FIG. 1 and simulation models of FIG. 2.

FIG. 4 is a graph showing curves 401, 411, 402, and 412 representing a relationship between some other operating parameters of the components of FIG. 1 and the simulation models of FIG. 2. In FIG. 4, curve 401 shows measured information that represents a relationship between a cutoff frequency $F_t$ and the collector current $I_C$ measured from a physical transistor, which may be schematically represented as transistor 110 of schematic diagram 100 of FIG. 1. Curve 402 of FIG. 4 shows simulated information that represents a relationship between the cutoff frequency $F_t$ and the collector current $I_C$ obtained from a simulation (e.g., SPICE simulation) based on simulation diagram 200 of FIG. 2 and using the same operating voltage values that were used to obtain curve 401. As shown in FIG. 4, curves 401 and 402 do not always closely fit with each other when the collector current $I_C$ is approximately 10 mA (or $10^{-2}$ A) to approximately 100 mA (or $10^{-1}$ A). The example voltage values used to obtain curve 401 during a measurement and curve 402 during a simulation may include a base-emitter voltage $V_{BE}$ greater than 1.0 volt and a collector-emitter voltage $V_{CE}$ of approximately 2.8 volts. Similarly to curves 401 and 402, curve 411 of FIG. 4 shows measured information and curve 412 shows simulated information but at a different $V_{CE}$ of approximately 0.8 volt. As shown in FIG. 4, curves 411 and 412 do not always closely fit with each other when the collector current $I_C$ is approximately 10 mA (or $10^{-2}$ A) to approximately 100 mA (or $10^{-1}$ A).

The differences between the simulated information and measured information illustrated in FIG. 3 and FIG. 4 may be attributed to the performance of transistor simulation model 210. For example, transistor simulation model 210 may include a conventional simulation model such as a Gummel Poon transistor simulation model, a VBIC transistor simulation module, or another transistor simulation model known to those skilled in the art. In some cases, these conventional transistor simulation models may provide simulated information that inaccurately predicts aspects of the circuit behavior of an actual transistor. The inaccurate behavior of the circuit may occur because of insufficient device physics description of the simulation models being used such as Gummel Poon or VBIC transistor model. More complex conventional models, such as High Current Model (HICUM) or MEXTRAM, may be used to describe transistor behavior more accurately. However, complex conventional models may be unfavorable due to factors such as higher cost, greater model complexity and/or lower simulation speed.

The description below with reference to FIG. 5 through FIG. 10 shows apparatus and methods associated with an improved transistor simulation model according to various embodiments of the invention.

Figure 5:
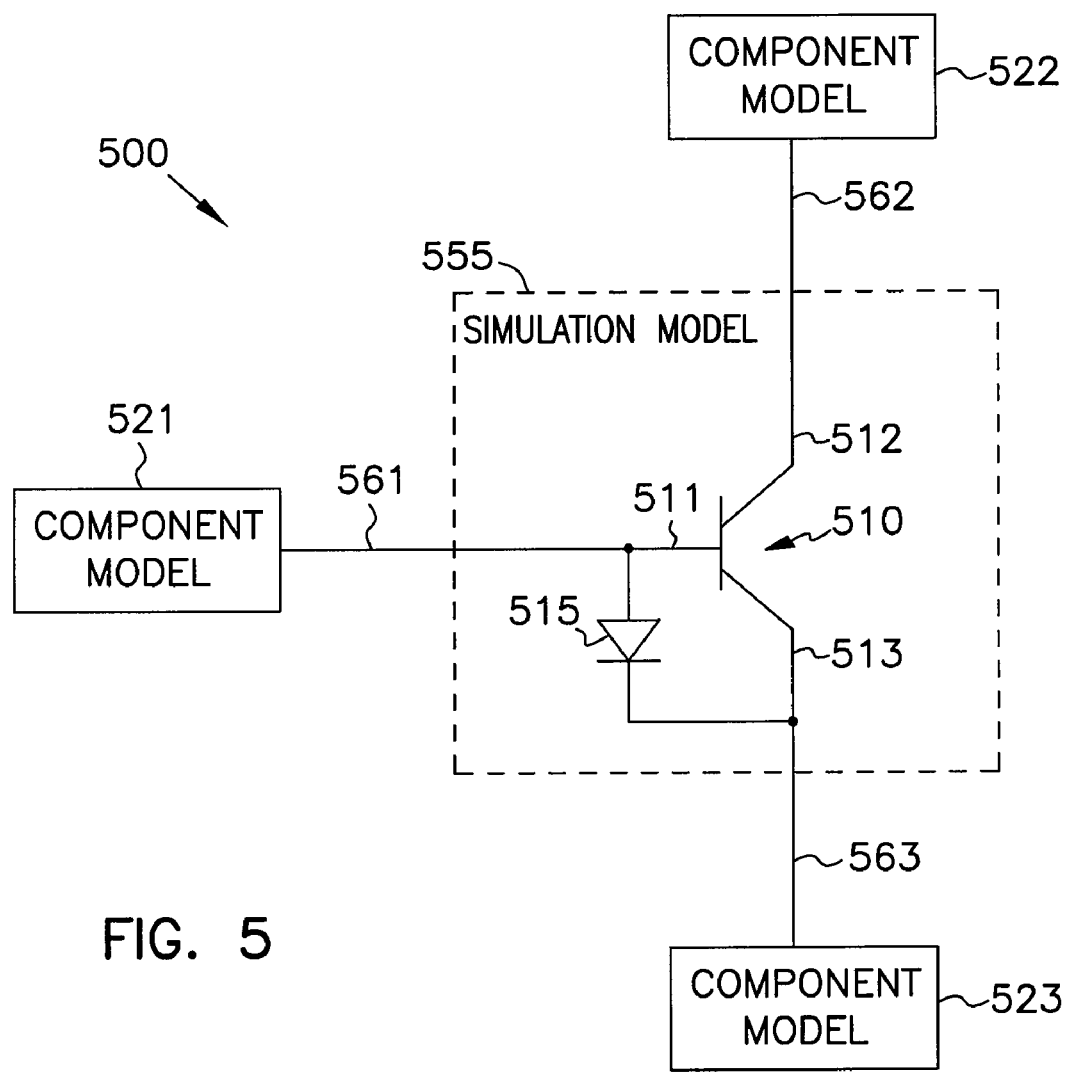
FIG. 5 is a simulation diagram showing simulation models for the components of FIG. 1 according to various embodiments of the invention.

FIG. 5 is a simulation diagram 500 showing simulation models for the components of FIG. 1, according to various embodiments of the invention. In FIG. 5, a simulation model 555 represents a transistor simulation model of transistor 110 of FIG. 1. Component models 521, 522, and 523 of FIG. 5 represent simulation models of the corresponding circuit components 121, 122, and 123 of FIG. 1. A simulator, which may use SPICE or other simulation programs, may use simulation diagram 500 to simulate transistor 110 and circuit components 121, 122, and 123 of FIG. 1.

As shown in FIG. 5, simulation diagram 500 may not represent a model of schematic diagram 100 of FIG. 1 in a component-to-component arrangement fashion. For example, simulation model 555 of FIG. 5 includes a combination or a subcircuit of two models, a transistor simulation model 510 and a diode simulation model 515, to represent a single transistor such as transistor 110 of FIG. 1. Transistor simulation model 510 and diode simulation model 515 may include conventional transistor simulation models and diode simulation models that are known to those skilled in the art. For example, diode simulation model 515 may include a conventional P-N junction diode simulation model. In another example, transistor simulation model 510 may include a conventional Gummel Poon transistor simulation model, a VBIC transistor module, or another known transistor simulation model. In some cases, using simulation model 555 with a combination of a transistor simulation model and diode simulation model to represent a model of a transistor, such as transistor 110, may provide simulated information that more accurately predicts the circuit behavior of the actual transistor. For example, in cases where a transistor is fabricated using a silicon-germanium bi-CMOS (complementary metal-oxide-semiconductor) process, simulating the transistor using simulation model 555 may provide simulated information that more accurately predicts the circuit behavior of the transistor.

As shown in FIG. 5, simulation model 555 may include nodes 561, 562, and 563. Diode simulation model 515 is coupled between nodes 561 and 562. Transistor simulation model 510 may include base 511, collector 512, and emitter 513 terminals that are coupled to corresponding nodes 561, 562, and 563 of simulation model 555. Nodes 561, 562, and 563 may correspond to base 111, collector 112, and emitter 113 terminals of transistor 110, respectively. Thus, although schematic diagram 100 of FIG. 1 does not include a diode coupled between base 111 and emitter 113 of transistor 110, simulation model 555 of FIG. 5 includes a diode simulation model, such as diode simulation model 515, coupled between base 511 and emitter 513 of transistor simulation model 510. The addition of diode simulation model 515 may improve the accuracy of the simulation.

Figure 6:
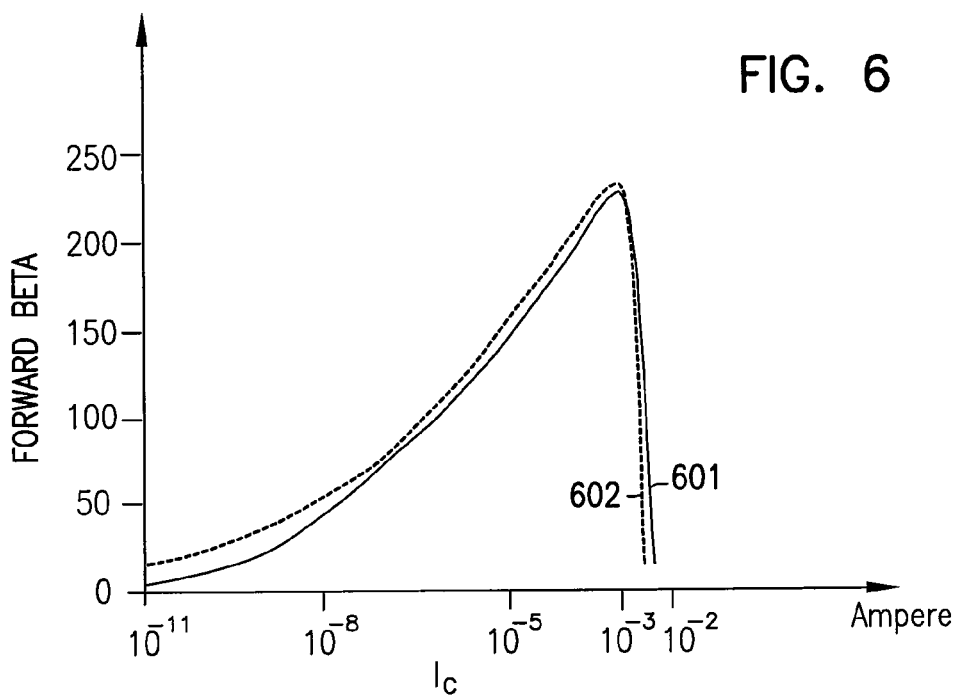
FIG. 6 is a graph showing curves representing a relationship between some operating parameters of the components of FIG. 1 and simulation models of FIG. 5 according to various embodiments of the invention.
Figure 7:
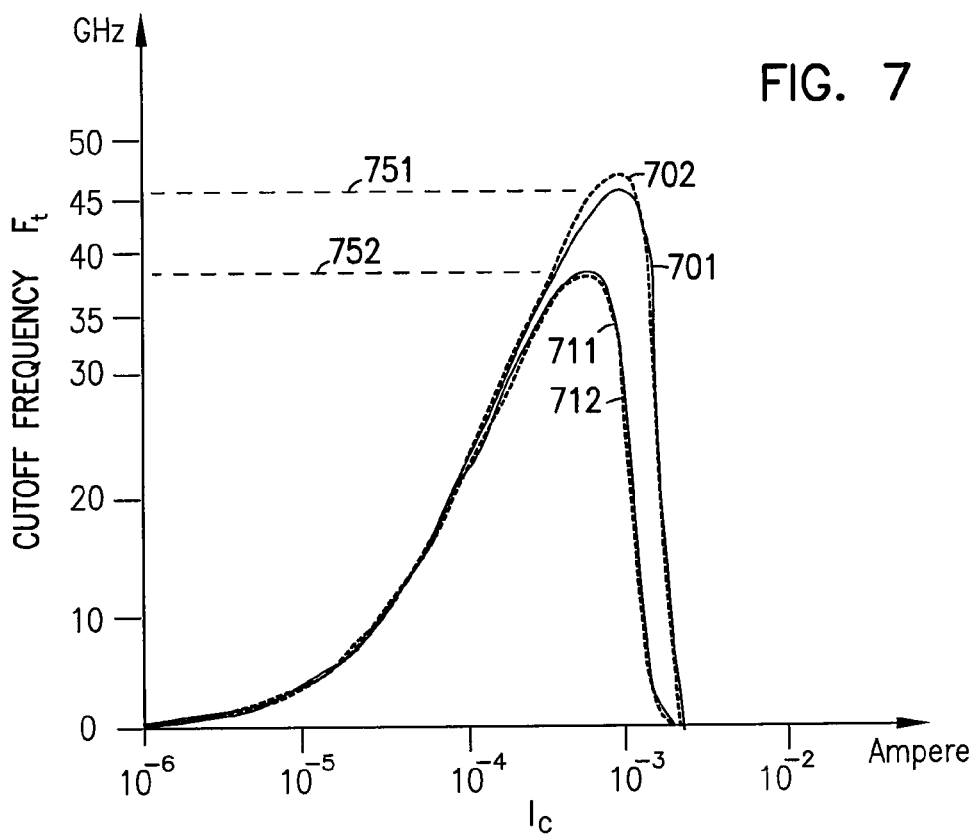
FIG. 7 is a graph showing curves representing a relationship between some other operating parameters of the components of FIG. 1 and simulation models of FIG. 5 according to various embodiments of the invention.

FIG. 6 and FIG. 7 are graphs showing curves representing relationships between various operating parameters of the components of FIG. 1 and the simulation models of FIG. 5. In the description below with reference to FIG. 6 and FIG. 7, simulated information represents information obtained from simulations using simulation models and techniques described herein. Measured information represents information obtained from actual circuits. The inventor has used the simulation models and techniques described herein for several years to simulate a number of circuits that were compared to actual circuits. Graphical comparisons are shown in FIG. 6 and FIG. 7.

FIG. 6 is a graph showing curves 601 and 602 representing a relationship between some operating parameters of the components of FIG. 1 and the simulation models of FIG. 5. In FIG. 6, curve 601 shows measured information that represents a relationship between a forward beta and a collector current $I_C$ measured from a physical transistor, which may be schematically represented as transistor 110 of schematic diagram 100 of FIG. 1. Curve 602 of FIG. 6 shows simulated information that represents a relationship between the forward beta and the collector current $I_C$ of transistor simulation model 510 obtained from a simulation (e.g., SPICE simulation) based on simulation diagram 500 of FIG. 5. As shown in FIG. 6, curves 601 and 602 closely fit with each other when the collector current $I_C$ is approximately 1 mA (or $10^{-3}$ A) to approximately 10 mA (or $10^{-2}$ A).

FIG. 7 is a graph showing curves 701, 711, 702, and 712 representing a relationship between some other operating parameters of the components of FIG. 1 and the simulation models of FIG. 5. In FIG. 7, curve 701 shows measured information that represents a relationship between a cutoff frequency $F_t$ and the collector current $I_C$ measured from a physical transistor, which may be schematically represented as transistor 110 of schematic diagram 100 of FIG. 1. Curve 702 of FIG. 7 shows simulated information that represents a relationship between the cutoff frequency $F_t$ and the collector current $I_C$ obtained from a simulation (e.g., SPICE simulation) based on simulation diagram 500 of FIG. 5 and using the same operating voltage values that were used to obtain curve 701. As shown in FIG. 7, curve 701 includes a peak cutoff frequency 751 of approximately between 45 gigahertz and 50 gigahertz. As also shown in FIG. 7, curves 701 and 702 closely fit with each other when the collector current $I_C$ is approximately 1 mA (or $10^{-3}$ A) to approximately 10 mA (or $10^{-2}$ A). The example voltage values used to obtain curve 701 during a measurement and curve 702 during a simulation may include a base-emitter voltage $V_{BE}$ greater than 1.0 volt and a collector-emitter voltage $V_{CE}$ of approximately 1.8 volts. Similarly to curves 701 and 702, curve 711 of FIG. 7 shows measured information and curve 712 shows simulated information but at a different $V_{CE}$ of approximately 0.8 volt. As shown in FIG. 7, curve 711 includes a peak cutoff frequency 752 of approximately between 35 gigahertz and 40 gigahertz. As also shown in FIG. 7, curves 711 and 712 closely fit with each other when the collector current $I_C$ is approximately 1 mA (or $10^{-3}$ A) to approximately 10 mA (or $10^{-2}$ A).

The close fit between curves 601 and 602 of FIG. 6, curves 701 and 702, and curves 711 and 712 of FIG. 7 may indicate that using simulation model 555 as a transistor simulation model for a transistor may provide simulated information that more accurately predicts the behavior in an actual transistor. As described above, simulation model 555 may include conventional transistor and diode simulation models. Therefore, creating a simulation model for a transistor, such as transistor 110, may be relatively easy, quick, and inexpensive. Further, since conventional transistor and diode simulation models are used by many conventional simulators, simulation model 555 may be readily added to the libraries of conventional simulators. Moreover, since simulation model 555 combines two conventional models, users of conventional simulators may easily use or create simulation model 555. In addition, conventional transistor simulation models such as the Gummel Poon transistor simulation model may not accurately describe the cutoff frequency $F_t$ or maximum frequency of oscillation ($F_{MAX}$) of a transistor at a relatively high frequency, such as a frequency of 25 gigahertz and higher. However, in applications with a relatively higher frequency (e.g., 25 gigahertz and higher), simulation model 555 may adequately provide the frequency characteristics of the transistor as described above with reference to FIG. 7.

The above description with reference to FIG. 5 through FIG. 7 uses an NPN bipolar transistor, such as transistor 510 and transistor simulation model 510, as an example. A person skilled in the art, however, may readily recognize different variations based on the description herein. For example, a PNP bipolar transistor may also be modeled based on the description herein such that in FIG. 5, a PNP bipolar transistor simulation model would replace the NPN bipolar transistor simulation model 510 and the diode simulation model would be coupled between the base and collector of the PNP bipolar transistor simulation model. The PNP bipolar transistor simulation model may include a conventional PNP bipolar transistor simulation model.

Figure 8:
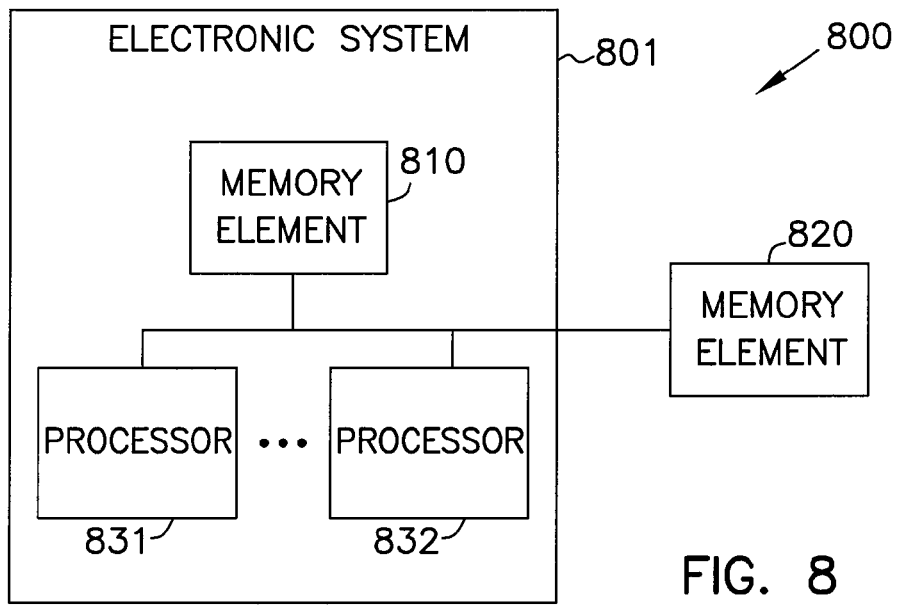
FIG. 8 shows a partial block diagram of an apparatus including memory elements to store information of a simulation model according to various embodiments of the invention.

FIG. 8 shows a partial block diagram of an apparatus 800 including memory elements 810 and 820 to store information of a simulation model according to various embodiments of the invention. Apparatus 800 may include an electronic system 801, which may include a personal computer (PC) or other electronic products. Electronic system 801 may include a simulator or may be used as a simulator to simulate a transistor such as transistor 110 of FIG. 1. As shown in FIG. 8, electronic system 801 may also include one or more processors 831 and 832 to process information that may be provided by one or both of memory elements 810 and 820.

The information of the simulation model, such as simulation model 555 of FIG. 5, stored in memory elements 810 and 820 may include information associated with simulation model name, various node names, and model names of the transistor and diode simulation models. The information may further include specific connections between the transistor and diode simulation models. For example, the information of the simulation model stored in memory elements 810 and 820 may include information of nodes, such as nodes 561, 562, and 563 of FIG. 5, and information indicating the names and connections associated with the transistor and diode simulation models, such as transistor simulation model 510 and diode simulation model 515 of FIG. 5.

Since memory elements 810 and 820 may store information of a simulation model, memory element 810, memory element 820, or both may anticipate in a simulation to simulate a transistor. For example, apparatus 800 may store the information of the simulation model, such as simulation model 555, in a library of the simulator in which the library may be included in memory element 810, memory element 820, or both. A user may use the simulation model, such as simulation model 555, in the library to simulate a transistor, such as transistor 110 of FIG. 1.

Memory elements 810 and 820 may include non-volatile memory, volatile memory, or a combination of both. For example, memory elements 810 and 820 may include a dynamic random access memory (DRAM) device, a static random access memory (SRAM) device, a flash memory device, an electrically erasable programmable read only memory (EEPROM) device, a magnetic memory (e.g., a hard drive) device, an optical memory device (e.g., CD-ROM or DVD), or a combination of these memory devices, or other types of memory devices. In some cases, memory element 820 may include a CD-ROM or a DVD and memory element 810 may include a combination of DRAM, SRAM, flash, and magnetic memory devices. FIG. 8 shows apparatus 800 with both memory elements 810 and 820 as an example. Apparatus 800, however, may omit one of memory elements 810 and 820.

Each of memory elements 810 and 820 may also include instructions (e.g., software instructions) to operate on the information stored thereon including information of a simulation model, such as simulation model 555 of FIG. 5. One or more of processors 831 and 832 may use information stored in one or both of memory elements 810 and 820 during an operation such as during a simulation of a transistor. Thus, each of memory elements 810 and 820 may also be viewed as a machine-readable medium comprising instructions, which when implemented by one or more processors (such as one or more of processors 831 and 832) perform one or more operations. The operation (or operations) may include simulating a transistor using a simulation model that includes a transistor simulation model coupled to diode simulation model. For example, the operation (or operations) may include simulating transistor 110 (FIG. 1) using simulation model 555 (FIG. 5) that includes a transistor simulation model 510 coupled to diode simulation model 515. The operation (or operations) may include one or more of the activities described below with reference to FIG. 9 and FIG. 10.

Figure 9:
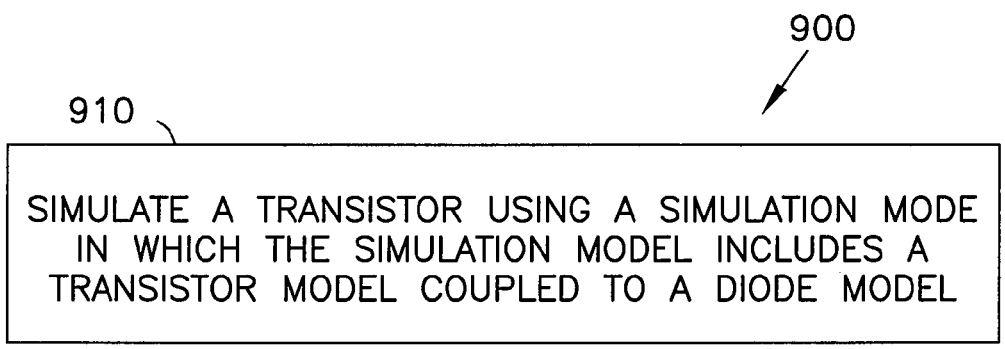
FIG. 9 shows a method of simulating a transistor according to various embodiments of the invention.

FIG. 9 shows a method 900 of simulating a transistor according to various embodiments of the invention. Activity 910 of method 900 may include simulating a transistor using a simulation model that includes a transistor simulation model coupled to diode simulation model. The transistor simulated by method 900 may include transistor 110 of FIG. 1. The simulation model used in method 900 may include simulation model 555 of FIG. 5. Method 900 may use the simulation model in a SPICE simulation or other simulation programs to simulate the transistor. Method 900 may include activities described above with reference to FIG. 5 through FIG. 8.

Figure 10:
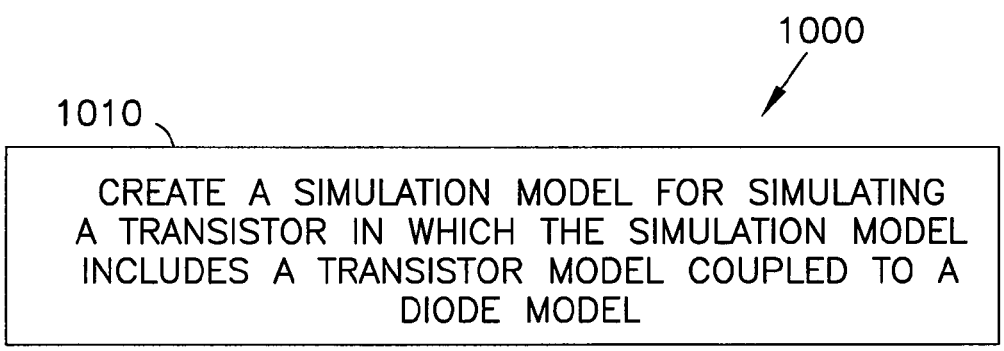
FIG. 10 shows a method of creating a simulation model according to various embodiments of the invention.

FIG. 10 shows a method 1000 of creating a simulation model according to various embodiments of the invention. Activity 1010 of method 1000 may include creating a simulation model for simulating a transistor. The simulation model may include a transistor simulation model coupled to a diode simulation model. The simulation model created by method 1000 may include simulation model 555 of FIG. 5 and may be used in a simulation such as a SPICE simulation or other simulation program.

In creating the simulation model, method 1000 may include providing information to indicate the connections among the transistor simulation model, the diode simulation model, and nodes of the simulation model. For example, method 1000 may provide information to indicate the connections among an anode and a cathode of the diode simulation model, a base, a collector, and an emitter of the transistor simulation model, and nodes of the simulation model. Method 1000 may provide information to indicate that the nodes of the simulation model, such as nodes 561, 562, and 563 of simulation model 555 of FIG. 5, correspond to the base, collector, and emitter of a transistor. The information provided by method 1000 to create the simulation model may include information that conforms to the SPICE simulation format. Method 1000 may provide the information to create the simulation model to an apparatus, such as apparatus 800 of FIG. 8. The apparatus may receive and store the information of the simulation model created by method 1000 and use the information to simulate a transistor. Method 1000 may include activities described above with reference to FIG. 5 through FIG. 9.

One or more embodiments described herein include methods and apparatus for simulating a transistor using a simulation model that includes a transistor simulation model coupled to diode simulation model. Other embodiments including additional methods and apparatus are described above with reference to FIG. 1 through FIG. 10.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of other embodiments. Many other embodiments will be apparent to those of skill in the art upon studying and understanding the above description.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the claims.

What is claimed is:

1. A method comprising:
    simulating a transistor using a simulation model that includes a transistor simulation model coupled to a diode simulation model, wherein the transistor simulation model includes one of a Gummel Poon bipolar transistor simulation model or a Vertical Bipolar Intercompany Model (VBIC) transistor simulation model, wherein the coupling of the transistor simulation model to the diode simulation model is configured to rectify a difference between a forward beta of the transistor simulation model and a forward beta of the transistor within a first collector current range or a difference between a cutoff frequency of the transistor simulation model and a cutoff frequency of the transistor within a second collector current range.

2. The method of claim 1, wherein the diode simulation model is coupled between a first node and a second node of the simulation model, and the transistor simulation model includes a base of the transistor simulation model coupled to the first node and one of a collector of the transistor simulation model or an emitter of the transistor simulation model coupled to the second node.

3. The method of claim 2, wherein the first node corresponds to a base of the transistor and the second node corresponds to one of a collector or an emitter of the transistor.

4. The method of claim 1, wherein simulating the transistor includes using Simulation Program with Integrated Circuit Emphasis (SPICE) simulation model.

5. The method of claim 1, wherein the first collector current range includes current between one milliampere and one-hundred milliampere.

6. The method of claim 1, wherein the second collector current range includes current between one milliampere and one-hundred milliampere.

7. A machine-readable, non-transitory medium comprising instructions, which when implemented by one or more processors perform the following operations:
    simulating a transistor using a simulation model that includes a transistor simulation model coupled to a diode simulation model, wherein the transistor simulation model includes one of a Gummel Poon bipolar transistor simulation model or a Vertical Bipolar Intercompany Model (VBIC) transistor simulation model, wherein the coupling of the transistor simulation model to the diode simulation model is configured to rectify a difference between a forward beta of the transistor simulation model and a forward beta of the transistor within a first collector current range or a difference between a cutoff frequency of the transistor simulation model and a cutoff frequency of the transistor within a second collector current range.

8. The machine-readable medium of claim 7, wherein the diode simulation model is coupled between a first node and a second node of the simulation model, and the transistor simulation model includes a base of the transistor simulation model coupled to the first node and one of a collector of the transistor simulation model or an emitter of the transistor simulation model coupled to the second node.

9. The machine-readable medium of claim 8, wherein the first node corresponds to a base of the transistor and the second node corresponds to one of a collector or an emitter of the transistor.

10. A method comprising:
    creating a simulation model for simulating a transistor, the simulation model including a transistor simulation model coupled to a diode simulation model, wherein the coupling of the transistor simulation model to the diode simulation model is configured to rectify a difference between a forward beta of the transistor simulation model and a forward beta of the transistor within a first collector current range or a difference between a cutoff frequency of the transistor simulation model and a cutoff frequency of the transistor within a second collector current range.

11. The method of claim 10, wherein creating the simulation model includes providing information to indicate that an anode of the diode simulation model and a base of the transistor simulation model are coupled to a first node of the simulation model, and providing information to indicate that a cathode of the diode simulation model and an emitter of the transistor simulation model are coupled to a second node of the simulation model.

12. The method of claim 11, wherein creating the simulation model includes providing information to indicate that the first node corresponds to the base of the transistor, and providing information to indicate that the second node corresponds to an emitter of the transistor.

13. The method of claim 12, wherein creating the simulation model further includes providing information to indicate that a collector of the transistor simulation model is coupled to a third node of the simulation model, and providing information to indicate that the third node corresponds to a collector of the transistor.

14. The method of claim 13, wherein the transistor simulation model includes a Gummel Poon bipolar transistor simulation model.

15. The method of claim 13, wherein the transistor simulation model includes a Vertical Bipolar Intercompany Model (VBIC) transistor simulation model.

16. The method of claim 13, wherein the information conforms to Simulation Program with Integrated Circuit Emphasis (SPICE) simulation format.

17. An apparatus comprising:
    a memory element configured to store information of a simulation model for simulating a transistor, the simulation model including a transistor simulation model and a diode simulation model coupled between a base of the transistor simulation model and one of a collector or an emitter of the transistor simulation model, wherein coupling of the diode simulation model is configured to rectify a difference between a forward beta of the transistor simulation model and a forward beta of the transistor within a first collector current range or a difference between a cutoff frequency of the transistor simulation model and a cutoff frequency of the transistor within a second collector current range.

18. The apparatus of claim 17, wherein the memory element is further configured to anticipate in a simulation when the transistor is simulated in the simulation.

19. The apparatus of claim 17 further comprising at least one processor configured to access the memory element.

20. The apparatus of claim 17, wherein the memory element includes a nonvolatile memory device.

* * * * *